United States Patent
Shinozaki et al.

(10) Patent No.: US 10,416,527 B2
(45) Date of Patent: Sep. 17, 2019

(54) OPTICAL MODULATOR

(71) Applicant: Sumitomo Osaka Cement Co., Ltd, Tokyo (JP)

(72) Inventors: Minoru Shinozaki, Tokyo (JP); Toru Sugamata, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/927,496

(22) Filed: Mar. 21, 2018

(65) Prior Publication Data

US 2018/0275481 A1 Sep. 27, 2018

(30) Foreign Application Priority Data

Mar. 23, 2017 (JP) .................. 2017-057018

(51) Int. Cl.
| | | |
|---|---|---|
| *G02B 6/12* | (2006.01) | |
| *G02F 1/21* | (2006.01) | |
| *G02F 1/225* | (2006.01) | |
| *G02B 26/00* | (2006.01) | |
| *H01S 5/022* | (2006.01) | |
| *G02F 1/03* | (2006.01) | |
| *G02F 1/01* | (2006.01) | |

(52) U.S. Cl.
CPC ....... *G02F 1/2255* (2013.01); *G02B 6/12007* (2013.01); *G02B 26/001* (2013.01); *G02F 1/0121* (2013.01); *G02F 1/0305* (2013.01); *H01S 5/02276* (2013.01); *G02F 2001/0113* (2013.01); *G02F 2001/212* (2013.01); *G02F 2201/505* (2013.01); *G02F 2203/15* (2013.01)

(58) Field of Classification Search
CPC .................. G02B 6/12; G02F 1/21
USPC ............................................ 385/3
See application file for complete search history.

(56) References Cited

U.S. PATENT DOCUMENTS

| | | | | |
|---|---|---|---|---|
| 5,172,471 A | * | 12/1992 | Huang | ............... H01L 23/5286 174/538 |
| 5,764,826 A | * | 6/1998 | Kuhara | .................. G02B 6/421 250/227.11 |
| 8,184,929 B2 | * | 5/2012 | Kish, Jr. | ................ B82Y 20/00 385/1 |
| 8,428,399 B2 | * | 4/2013 | Takabayashi | .......... B82Y 20/00 385/2 |
| 2003/0044100 A1 | * | 3/2003 | Kondo | .................. G02F 1/0356 385/3 |

(Continued)

FOREIGN PATENT DOCUMENTS

| | | |
|---|---|---|
| JP | 2003338520 A | 11/2003 |
| JP | 2014195061 A | 10/2014 |

*Primary Examiner* — Kaveh C Kianni
(74) *Attorney, Agent, or Firm* — Greer, Burns & Crain, Ltd.

(57) ABSTRACT

An optical modulator includes an optical modulation element that is accommodated in a housing. A plurality of lead pins, which are electrically connected to the optical modulation element through wire bonding, are fixed to a lateral wall of the housing. Each of the plurality of lead pins includes a portion that protrudes into an inner space (inner surface side) of the housing. A resonance suppressing structure (for example, a concave portion), which is configured to suppress resonance between the lead pins, is provided in a lateral wall portion to which the plurality of lead pins are fixed.

5 Claims, 8 Drawing Sheets

(56) References Cited

U.S. PATENT DOCUMENTS

| | | | |
|---|---|---|---|
| 2004/0240036 A1* | 12/2004 | Porte | G02F 1/0356 359/322 |
| 2004/0264888 A1* | 12/2004 | Go | G02B 6/325 385/92 |
| 2006/0097365 A1* | 5/2006 | Song | H01L 23/3128 257/666 |
| 2007/0147724 A1* | 6/2007 | Ishizaka | G02F 1/0147 385/8 |
| 2011/0013863 A1* | 1/2011 | Shimizu | G02F 1/0121 385/2 |
| 2012/0301070 A1* | 11/2012 | Shimizu | G02F 1/0121 385/2 |
| 2013/0187541 A1* | 7/2013 | Urakawa | H05H 7/08 315/5.53 |
| 2015/0070709 A1* | 3/2015 | Porte | G02F 1/0356 356/482 |
| 2016/0161771 A1* | 6/2016 | Sugiyama | G02B 6/4201 385/3 |
| 2019/0025612 A1* | 1/2019 | Katou | H05K 1/028 |

\* cited by examiner

OPTICAL MODULATOR

CROSS-REFERENCE TO RELATED APPLICATIONS

This application claims the benefit of Japanese Patent Application No. 2017-057018 filed Mar. 23, 2017, the disclosure of which is herein incorporated by reference in its entirety.

BACKGROUND OF THE INVENTION

Field of the Invention

The present invention relates to an optical modulator, and particularly to, an optical modulator such as a dual polarization-quadrature phase shift keying (DP-QPSK) modulator that includes a plurality of lead pins.

Description of Related Art

In an optical communication field, an optical transmission apparatus on which a high-frequency optical modulator is mounted has been used. In recent years, a demand for high capacity and miniaturization of the optical transmission apparatus has increased. With regard to the high capacity of the optical transmission apparatus, an optical modulator, in which transmission capacity is further enhanced by changing a modulation form from intensity modulation (on-off keying) and the like in the related art into a transmission format such as QPSK, DP-QPSK, and the like which use phase modulation and to which multi-level modulation or polarization multiplexing is introduced, has been realized.

For example, in a case of a DP-QPSK modulator, four RF input units which input radio frequency signals (RF signals) and four optical modulator units which perform modulation in correspondence with the input signals are integrated in one optical element, thereby realizing small-size and high-capacity transmission. As a substrate of an optical modulation element, recently, a substrate using Si in addition to materials such as $LiNbO_3$ and InP, and the like are known.

As illustrated in FIG. 1, an optical modulator includes a signal input unit for a bias control of a plurality of optical modulator units formed on an optical modulation element and a plurality of lead pins as output units of a monitor PD (photo detector) that generates an electrical signal that is used to perform the bias control in addition to the RF input units. For example, as a DP-QPSK modulator in which four RF input units, four optical modulator units, and two monitor PDs for feedback are integrated, a DP-QPSK, which includes 18 lead pins including a ground pin or a not connect (NC) pin, is known. The lead pins are mainly used to input or output a DC signal. Furthermore, the necessary minimum number of the lead pins is not 18, and the number of the lead pins varies in accordance with presence or absence of a DC bias electrode or the ground pin, and the like. In a typical case, the number of pins, arrangement of the pins, and the like are standardized through business groups who manufacture or use the optical modulator.

As a configuration which includes the plurality of lead pins as described above, a multi-pin configuration such as butterfly pins of a semiconductor LD (semiconductor laser) housing is generally used. The plurality of lead pins are air-tightly sealed by embedding a ceramic substrate, on which an electrical interconnection or a bonding pad is patterned, in a hole formed in the housing, and fixing the ceramic substrate by using a brazing material and the like. In addition, a lead pin for substrate connection is fixed to the outside of the housing by using a brazing material or solder, and an optical element and an interconnection pattern on the ceramic substrate are electrically connected by using wire bonding on an inner side of the housing.

The butterfly pin configuration has an advantage that a multi-pin configuration can be realized in a small-size and high-accuracy manner, and in a high-density manner. However, the butterfly pin configuration has a disadvantage such things as increasing in size is difficult from the viewpoint of reliability due to a difference in a thermal expansion coefficient between a metal housing and a ceramic material (occurrence of ceramic substrate cracking or air-tight sealing leakage due to a temperature variation), increasing in the manufacturing cost, and the like. According to this, the butterfly pin is not used in a relatively large-sized DP-QPSK modulator that uses $LiNbO_3$ as a material, and the like. In the DP-QPSK modulator and the like, a lead pin configuration in which air-tight sealing is possible at a relatively low cost is used instead of the butterfly pin. In the lead pin configuration, a lead pin inserted into a hole, which passes through a lateral wall of the housing, is fixed by using a glass sealing material.

An electrical signal having a frequency component of DC to approximately MHz maybe applied to the lead pin that is used in the optical modulator, but a low-frequency electrical signal, which is lower in comparison to a high-frequency RF connector, is applied to the lead pin. Therefore, a configuration, in which the freedom of design is high and can be simply realized in such a manner that the pins are penetrated through the housing and are fixed thereto, is employed. The lead pin configuration enters the following cantilevered hollow state differently from the butterfly pin configuration of the semiconductor LD housing. Specifically, the pins are cantilevered on an inner side of the housing, and wire bonding for electrical connection is directly performed with respect to the lead pins. Furthermore, a state in which the lead pins are in the cantilevered hollow state represents that a part of the lead pins is fixed to a lateral wall of the housing, and a tip end (a portion that is wire-bonded) of a portion that protrudes into an inner space of the housing becomes a free end. For example, Japanese Laid-open Patent Publication No. 2014-195061 discloses an electronic apparatus having a structure in a hollow state in which the lead pins are cantilevered on an inner side of the housing.

Generally, the number of the lead pins, an interval between the lead pins, and the like are determined in accordance with the standard in respective industries. However, it is difficult to design and form interconnection pad portions on an optical modulation element side at an interval conforming to the standard due to various design restrictions. Accordingly, typically, a relay substrate is provided between electrode pad portions of the optical modulation element and the lead pins to easily perform connection between the lead pins and pad portions of the relay substrate, and connection between the electrode pad portions of the optical modulation element and the pad portions of the relay substrate.

In wire bonding connection, typically, ultrasonic vibration is applied during thermal compression so as to enhance connection strength and reproducibility of connection stability for short connection time. The function is introduced the majority of wire bonding apparatuses. For example, Japanese Laid-open Patent Publication No. 2003-338520 discloses a wire bonding apparatus in which an excitation frequency of capillary is set to a frequency different from a natural frequency of a wire.

SUMMARY OF THE INVENTION

It is demanded for connection strength of the wire bonding (a gold wire in many cases) to have sufficient connection reliability with respect to external trouble causes which may occur during assembly, transportation, installation, and operation of the optical modulator or the optical transmission apparatus. Accordingly, a jig for bonding connection condition presentation and the like are prepared in advance by the same material and in the same design as in the lead pins which are subjected bonding connection, and wire bonding conditions (a heating temperature, application power, application time, application weight, and the like) are determined.

In addition, typically, application of ultrasonic vibration is performed in addition to thermal compression of a wire for an improvement of connection strength, an improvement of stabilization and reproducibility of the connection strength, and the like in the wire bonding. A frequency of ultrasonic waves which are applied is different depending on the kind of apparatuses and an apparatus maker, and is approximately 30 kHz to 200 kHz.

The wire bonding conditions are set so that connection strength of a bonded wire becomes a value having a sufficient tolerance with respect to necessary minimum limit connection strength ($g_{min}$) in consideration of a connection strength distribution. For example, in a case where the limit connection strength $g_{min}$ required for the optical modulator is set to 2 g, the conditions are set so that average connection strength $g_0$ becomes 6 g that is three times of 2 g, and a design safety tolerance in consideration of the connection strength distribution becomes 4 g that is two times of 2 g.

The conditions are appropriately changed in accordance with various factors such as a diameter of a gold wire, a material or a surface state of an object to be bonded, an environment (the inside of a communication station, outdoors, the inside of an aircraft, the inside of a rocket, or the inside of a satellite) to which the optical modulator is adapted, and an adaptation reliability standard.

After the conditions having a sufficient tolerance are determined, if a material or a shape of a lead pin to be bonded, a housing fixing configuration, an apparatus that is used, and the like are the same in each case, even when performing wire bonding in a housing having a different design under the same conditions, connection having sufficient connection reliability is possible. However, the possibility is realized on the assumption that maintenance is made on the wire bonding apparatus for daily inspection, and thus main causes for apparatus failure and the like are removed.

In this situation, even in an existing DP-QPSK modulator, a demand for further miniaturization and large capacity has strongly increased. According to this, an examination on further miniaturization of the housing through introduction of various methods is in progress. Examples of the methods include a method in which an RF input unit is changed from a push-on type connector in the related art to a flexible printed circuit (FPC) and the like, a method in which miniaturization of polarization-combining part is attempted, a method in which miniaturization of the optical modulation element is attempted, and the like.

However, with regard to the small-sized DP-QPSK modulator and the like, when using wire bonding in which sufficient connection reliability is obtained and the results of mass production are sufficiently accumulated in the related art, it was found that bonding having connection strength lower than limit connection strength occurs in some cases. The bonding failure may occur in some cases even when performing wire bonding in a state in which a material and a shape of a lead pin to be bonded, a housing fixing configuration, and an apparatus that is used are the same in each case, and wire bonding conditions are the same in each case.

In a case where bonding having connection strength lower than the limit connection strength exists, there is a possibility of occurrence of a phenomenon (wire peeling-off) in which a wire is peeled-off from a lead pin. If the wire peeling-off occurs during operation of an optical communication system, serious failure, which leads to catastrophic failure in which the operation stops at a time, may occur as a significant influence.

In addition, an attempt for increasing transmission capacity by integrating a plurality of DP-QPSK modulation elements in one housing is also in progress from now on. According to this, the number of lead pins provided in the optical modulator further increases, and thus it is important to secure connection reliability.

It can be seen that the bonding having connection strength lower than the limit connection strength occurs due to a cause other than abnormality such as failure of the wire bonding apparatus and a connection surface state of the lead pin to be bonded. In addition, it can be seen that strength as in the related art is obtained as the connection strength with respect to a single lead pin. However, it was not clear why the problem occurs.

This phenomenon is newly manifested without being shown in the optical modulator of the related art, and becomes a serious problem of deteriorating reliability of the optical modulator as the basis of optical communication.

An object of the invention is to suppress deterioration of connection strength in wire bonding with respect to lead pins in an optical modulator including a plurality of the lead pins which are fixed to a lateral wall of a housing and include a portion protruding into an inner space of the housing.

To accomplish the object, an optical modulator of the invention has the following technical characteristics.

(1) According to an aspect of the invention, there is provided an optical modulator including an optical modulation element that is accommodated in a housing. A plurality of lead pins, which are electrically connected to the optical modulation element through wire bonding, are fixed to a lateral wall of the housing. Each of the plurality of lead pins includes a portion that protrudes into an inner space of the housing. A resonance suppressing structure, which is configured to suppress resonance between the lead pins, is provided in a lateral wall portion to which the plurality of lead pins are fixed.

(2) In the optical modulator according to (1), as the resonance suppressing structure, a concave portion or a convex portion, which is formed at least on an inner surface side of the lateral wall portion, may be provided.

(3) In the optical modulator according to (2), as the resonance suppressing structure, a concave portion or a convex portion which is formed on an outer surface side of the lateral wall portion may be further provided and a position of a step difference in the concave portion or the convex portion may be set to be different between the inner surface side and the outer surface side.

(4) In the optical modulator according to any one of (1) to (3), as the resonance suppressing structure, a material, of which at least one of a density and an elastic coefficient is different from at least one of a density and an elastic coefficient of a material of the housing, may be disposed at least at a part of the lateral wall portion.

(5) In the optical modulator according to any one of (1) to (4), as the resonance suppressing structure, a vibration absorbing member, which absorbs vibration, may be provided at least on an inner surface side of the lateral wall portion.

According to the aspect of the invention, resonance of other lead pins (particularly, lead pins for which wire bonding is completed) due to vibration, which occurs during wire bonding with respect to a lead pin, is suppressed, and thus it is possible to suppress deterioration of connection strength in the wire bonding with respect to the lead pin.

DETAILED DESCRIPTION OF THE INVENTION

Description will be given of an optical modulator according to the invention, and an optical transmission apparatus on which the optical modulator is mounted. Furthermore, the invention is not limited to by examples illustrated in the following embodiment.

First, description will be given of an overview of an example of the related art with reference to the accompanying drawings.

Figure 1:
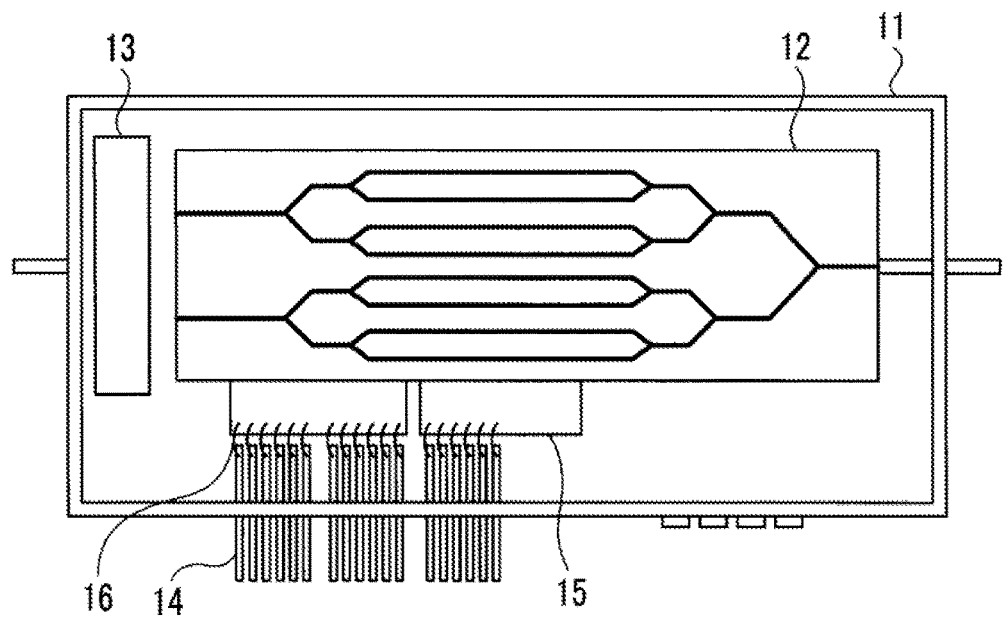
FIG. 1 is a view illustrating a configuration example of a DP-QPSK modulator in the related art.

FIG. 1 is a top view illustrating a configuration example of a DP-QPSK modulator of the related art. The DP-QPSK modulator in the same drawing has a structure in which an optical modulation element 12 in which an optical waveguide is formed in an optical element substrate, and a polarization-combining part 13 that combines a light wave modulated in the optical modulation element are mounted in a housing 11. Furthermore, an electrode that is used in optical modulation, an optical component for polarization combining, an RF input signal line inside a housing, and the like are not illustrated. As the optical element substrate in which the optical waveguide is formed, a substrate that uses $LiTaO_3$, InP, Si, and the like is used in addition to a substrate that uses $LiNbO_3$.

In a case of the DP-QPSK modulator, four sub-Mach-Zehnder optical waveguides are formed in the optical element substrate, and four high-frequency signal electrodes (not illustrated) configured to apply a modulation signal to each of the sub-Mach-Zehnder optical waveguides are formed. In correspondence with the configuration, a plurality of lead pins such as a DC lead pin for adjustment of a bias point and a PD signal lead pin for detection of a bias point with respect to each of the sub-Mach-Zehnder optical waveguides are necessary, and each of the lead pins are led out from a lateral surface of the housing.

An interval between the lead pins is determined in conformity to standards in many cases. Typically, the lead pins are arranged at a constant interval. However, it is very difficult to design electrodes pad on an optical modulation element side at the same position and interval as those of the lead pins due to various design factors and restrictions. Accordingly, as illustrated in FIG. 1, typically, a relay substrate 15, which relays electrode pad portions of the optical modulation element 12 and the lead pins 14, is provided. Furthermore, although not illustrated, in the relay substrate 15, pad portions with respect to the lead pins 14 and pad portions with respect to the electrode pad portions of the optical modulation element 12 are designed to face and to be adjacent to each other so as to enhance production efficiency. This configuration is employed to shorten a wire bonding length as much as possible, and to realize bonding in the same shape as much as possible in a range in which reliability is secured.

Figure 2:
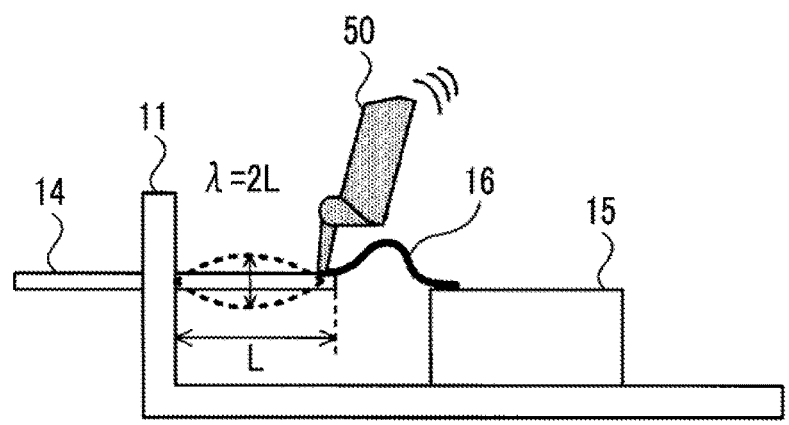
FIG. 2 is a view illustrating wire bonding with respect to a lead pin.

FIG. 2 is a view illustrating wire bonding with respect to each of the lead pins.

The lead pins 14 which pass through the housing 11 are fixed to the housing 11 with a glass sealing material by a fixing method of realizing both air-tight sealing and electrical insulation. The lead pins 14 are fixed to an inner surface of the housing 11 in a hollow cantilevered state. That is, the lead pins 14 are fixed to a lateral wall of the housing 11, and include a portion that protrudes into an inner space of the housing 11. A tip end of the portion is set as a free end. Bonding of a wire 16 for electrical connection is performed in the vicinity of the tip end (free end) of the lead pins 14.

Examples of the kind of the wire bonding include ball bonding and wedge bonding, and application of a pressure and ultrasonic waves is performed in a heated stated. Due to an ultrasonic thermal compression operation, wire bonding, in which connection strength is secured and a variation of connection reproducibility and connection strength is suppressed, is performed.

This is also true of wire bonding with respect to the lead pins in the hollow cantilevered state. In a case of the lead pins in the hollow cantilevered state, in the wire bonding with respect to the tip end (free end), an unstable impression apparently exists. However, when appropriately selecting bonding conditions (a temperature, ultrasonic power, a compression pressure, time, a wire material, a wire diameter, and the like), it is possible to realize the same satisfactory bonding as in wire bonding with respect to a connection pad and the like which are formed on a substrate.

It was found that the satisfactory bonding is obtained mainly in a case where the lead pins do not enter a state of resonating due to ultrasonic waves of a wire bonding apparatus during wire bonding, or in a case where the lead pins enter a resonance state in which a bonding portion and a housing fixing portion are set as both fixing ends.

FIG. 2 illustrates a resonance state, in which a frequency is the lowest, in other words, a resonance wavelength is the longest, in the resonance state in which the bonding portion and the housing fixing portions are set as both fixing ends. That is, when a length of a portion, which protrudes into the housing, of the lead pin 14 is set as L, the above-described resonance state corresponds to a case where a resonance wavelength λ becomes 2L. A portion at which a bonding tool of a wire bonding apparatus 50 comes into contact with the lead pin 14 operates as a fixing end. In a state in FIG. 2, vibration of the bonding portion is small even when the lead pin resonates, and sufficient connection reliability can be obtained through thermal compression by wire bonding and connection by ultrasonic waves in the related art.

Figure 3:
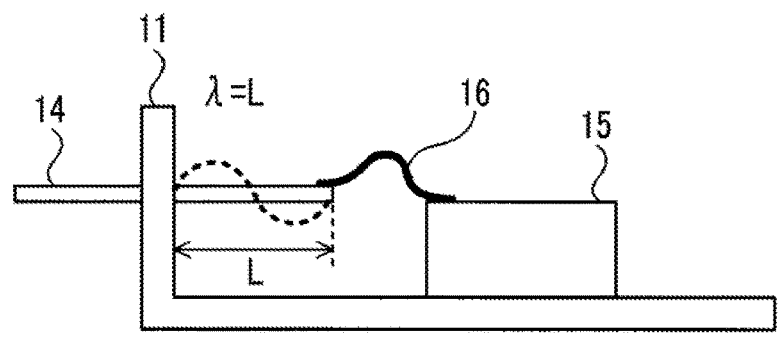
FIG. 3 is a view illustrating an example of a resonance state of the lead pin.

FIG. 3 illustrates a resonance state at a harmonic frequency (in other words, a harmonic wavelength) higher than the frequency in the resonance illustrated in FIG. 2 by one step in the resonance state by the same fixing ends as in FIG. 2. As described above, even in the same lead pin configuration and in the same resonance mode, it can be understood that the resonance frequency includes a plurality of resonance frequency when a harmonic component is added thereto.

Figure 4:
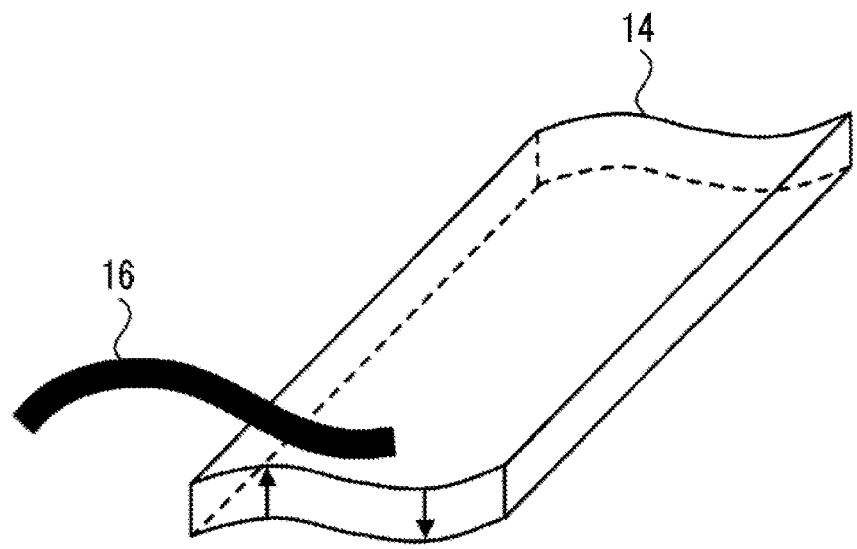
FIG. 4 is a view illustrating another example of the resonance state of the lead pin.

Examples of the resonance mode include not only a resonance mode (also referred to as a vertical resonance mode) in a direction perpendicular to a housing bottom surface as illustrated in FIG. 2 and FIG. 3, but also a resonance mode (also referred to as a horizontal resonance mode) in a direction horizontal to the housing bottom surface. In a case where a cross-sectional shape of the lead pin is a circular shape, a frequency of the vertical resonance mode and a frequency of the horizontal resonance mode are approximately the same as each other. However, as in a flat pin, in a case where the cross-sectional shape is a rectangular shape, a trapezoidal shape, a triangular shape, an elliptical shape, and the like, a basic resonance frequency is different between the vertical resonance mode and the horizontal resonance mode, and a harmonic resonance frequency is also different therebetween. In addition, in a case where the cross-sectional shape is a rectangular shape, as illustrated in FIG. 4, a resonance mode in a cross-sectional direction may also occur, and as a result, a plurality of resonance modes and a plurality of harmonic resonance frequencies may occur.

Figure 5:
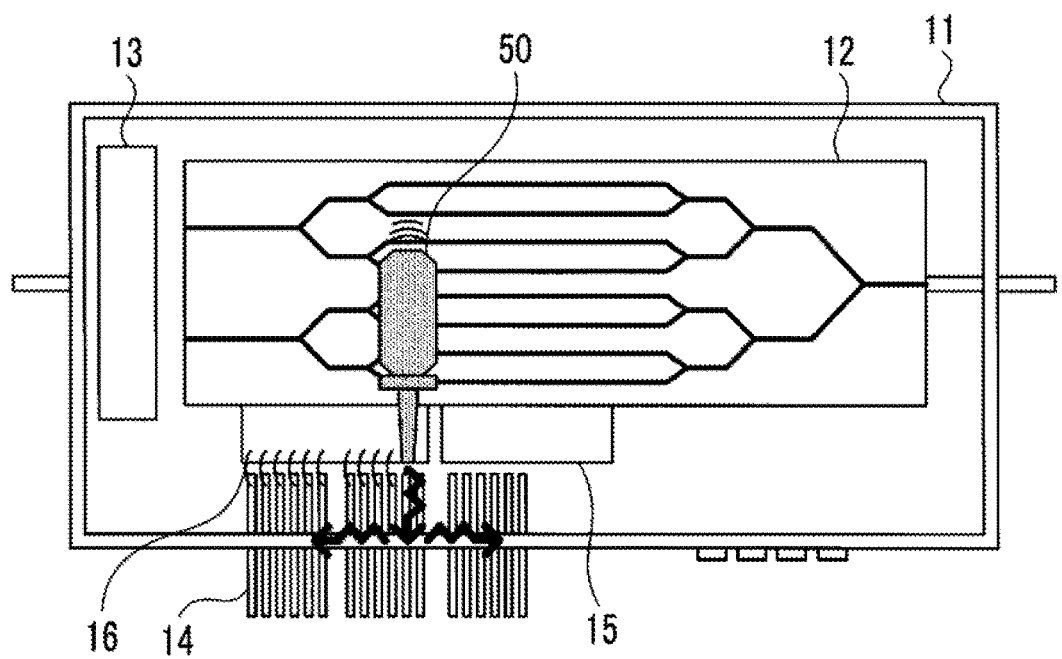
FIG. 5 is a view illustrating propagation of vibration due to the wire bonding.

FIG. 5 is a view illustrating an aspect in which vibration energy due to the above-described various kinds of resonance and the like propagates to other lead pins through a housing lateral wall to which lead pins in wire bonding are fixed, and causes the other lead pins to vibrate. In a case where lead pins as a vibration propagation destination obtain the propagating vibration energy and resonantly vibrate, a vibration width of the lead pins can be maximized.

In a case where wire bonding has performed in advance with respect to the lead pins as the vibration propagation destination, a bonding portion strongly vibrates due to the resonance of the lead pins. Typically, bonding is performed under conditions capable of attaining connection strength having a sufficient design tolerance with respect to limit connection strength so that sufficient connection strength can be maintained even when slight vibration or impact is applied. According to this, even when vibration is applied to the lead pins as described above, connection reliability is less likely to immediately deteriorate.

However, in a case where vibration is intermittently applied from a plurality of other lead pins, and in a case where the vibration energy is not attenuated so much and propagates, the original connection strength may deteriorate. In recent years, a pin interval is short or a pin formed unit interval is short in accordance with trend of miniaturization of the housing, and thus the vibration energy is not attenuated so much, and is likely to propagate to other lead pins.

Figure 6:
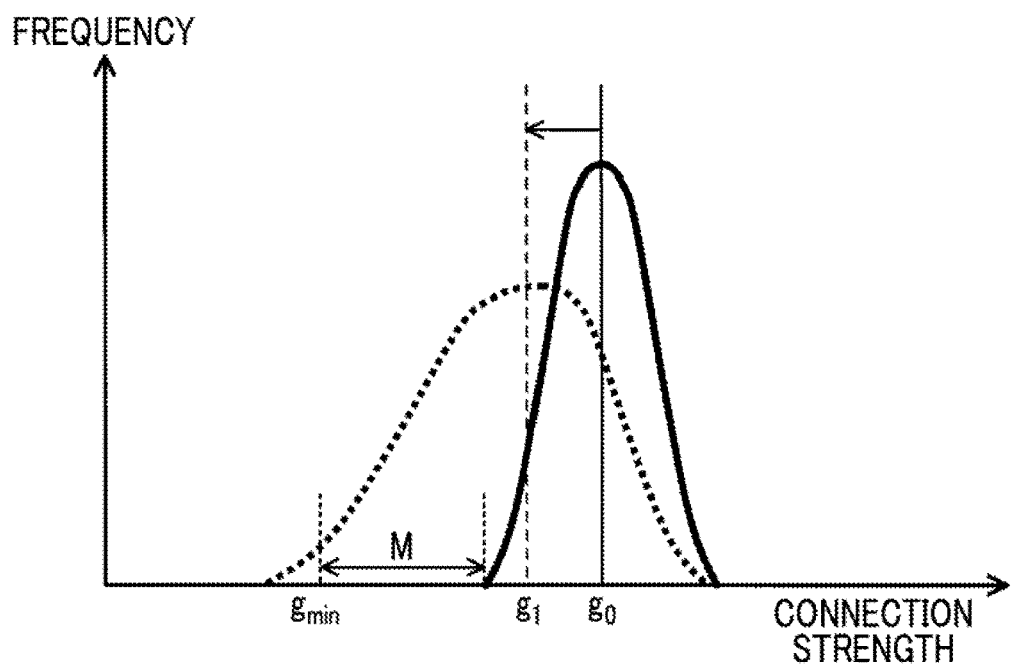
FIG. 6 is a view illustrating deterioration of wire connection strength due to propagation of vibration.

FIG. 6 is a graph illustrating a possibility that wire connection strength decreases due to propagation of vibration and thus a variation of the connection strength may increase. In the graph in FIG. 6, the horizontal axis represents the connection strength of a wire, and the vertical axis represents appearance frequency thereof. In addition, a distribution of the original connection strength is illustrated with a solid-line curve, and a distribution of connection strength that decreases due to propagation of vibration is illustrated with a broken-line curve. In addition, $g_0$ represents an average value of the original connection strength, $g_1$ represents an average value of connection strength that decreases due to propagation of vibration, grain represents necessary minimum limit connection strength of a bonded wire, and M represents a design tolerance with respect to the limit connection strength grain.

As illustrated in FIG. 6, the original average connection strength $g_0$ decreases to the average connection strength $g_1$ due to propagation of vibration, and spreading of connection strength distribution also increases. Accordingly, although sufficient connection strength is originally provided with respect to the limit connection strength $g_{min}$, the connection strength may be less than the limit connection strength $g_{min}$ in a statistical connection strength distribution.

This phenomenon is considered as a mechanism in which even when performing wire bonding under the same bonding conditions in a state in which a material or a shape of a lead pin that is subjected to the wire bonding, a housing fixing configuration, a using apparatus, and the like are the same in each case, bonding having strength lower than the limit connection strength occurs.

That is, even in wire bonding in which the above-described various factors are set to be the same in each case, if the housing is miniaturized and a pin interval or a pin formed unit interval is changed, connection strength of bonding provided in advance may vary due to propagation of vibration.

Figure 7:
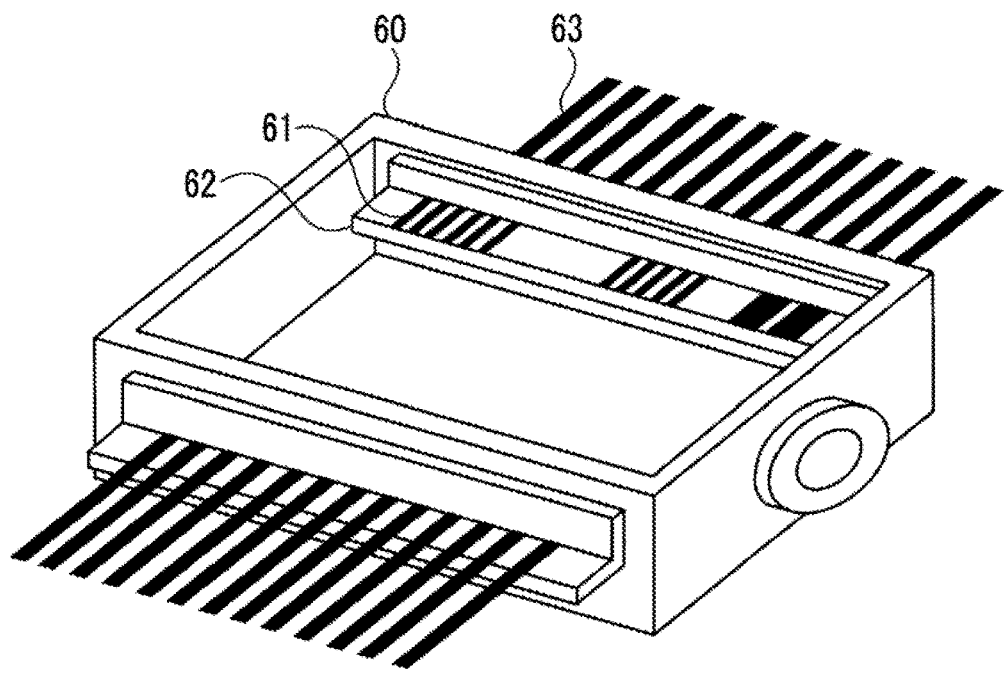
FIG. 7 is a view illustrating an example of a butterfly pin configuration of a semiconductor LD housing.

FIG. 7 illustrates an example of a butterfly pin configuration of a semiconductor LD housing as a reference. A semiconductor LD housing 60 in the same drawing is also a small-sized housing including a plurality of lead pins 63. As a bonding connection portion, a pad portion 61 inside the housing is patterned on a ceramic substrate 62, and the lead pins 63 exist only at the outside of the housing. Wire bonding on an inner side is performed with respect to the pad portion 61 on the ceramic substrate 62. Accordingly, the above-described resonance does not occur, and a problem related to wire bonding having strength lower than the limit strength does not occur.

In addition, as illustrated in FIG. 7, a configuration of forming a pad portion (bonding connection portion) on the ceramic substrate provided inside the housing is not used in an optical element such as the DP-QPSK modulator from the viewpoints of reliability due to a difference in a thermal expansion coefficient, a cost, and the like.

Here, a natural frequency f (Hz) due to vertical vibration of the lead pins can be calculated as follows (Expression 1). Furthermore, λ represents a constant that is determined from boundary conditions and a vibration mode, L represents a length of the lead pins, E represents a vertical elastic coefficient (Young's modulus) of a material of the lead pins, and ρ represents a mass per unit volume of the material of the lead pins.

$$f = \lambda/2\pi L \cdot \sqrt{(E/\rho)} \qquad \text{(Expression 1)}$$

For example, in a case of using a lead pin in which Fe ($E=200\times10^9$ N/m$^2$, $\rho=7.83\times10^6$ kg/m$^3$) is set as a material, a cross-sectional shape is set to a square shape (width: 0.35 mm), and a length is set to $0.8\times10^{-3}$ mm, vertical vibration of 50 kHz, 150 kHz, 250 kHz, and the like occurs. In addition, in a case of using a lead pin having a length of $1.7\times10^{-3}$ mm under the same conditions, vertical vibration of 23.5 kHz, 70.6 kHz, 117.6 kHz, and the like occurs. A vibration frequency that is applied by a wire bonding apparatus is approximately 30 kHz to 200 kHz, and a natural frequency of the lead pin is included in the vibration frequency. Accordingly, it can be seen that resonance of the lead pin is induced due to application of ultrasonic waves by the wire bonding apparatus, and thus there is a possibility that a bonding failure with connection strength lower than the limit connection strength $g_{min}$ may occur.

In the invention, an optical modulator is configured as follows so as to solve the above-described problem.

Figure 8:
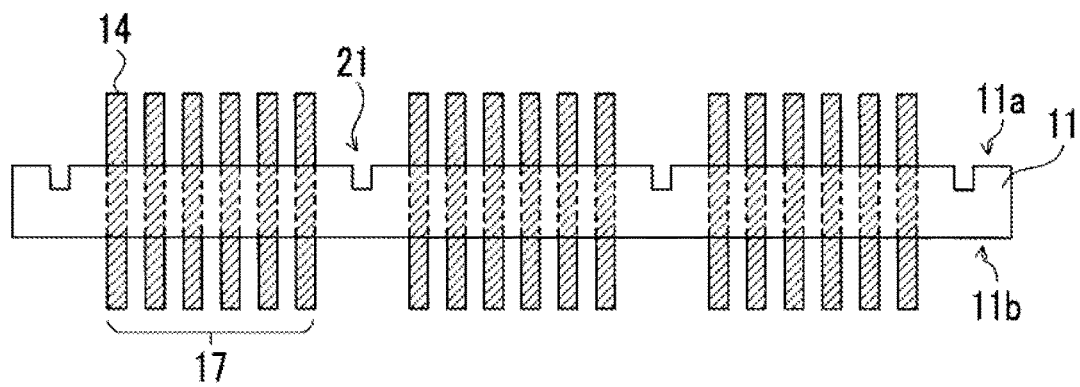
FIG. 8 is a view illustrating a resonance suppressing structure according to a first example of the invention.

That is, in the optical modulator in which the optical modulation element 12 is accommodated in the housing 11, as illustrated in FIG. 8 and the like, a plurality of lead pins 14, which are electrically connected to the optical modulation element 12 through wire bonding, are fixed to the lateral wall of the housing 11. Each of the plurality of lead pins 14 include a portion that protrudes into an inner space (inner surface 11a side) of the housing 11. In addition, a resonance suppressing structure (for example, a concave portion 21), which is configured to suppress resonance between the lead pins, is provided in a lateral wall portion to which the plurality of lead pins 14 are fixed.

An effect of the above-described resonant vibration on other lead pins occurs when vibration waves propagate to the other lead pins through the housing lateral wall to which the lead pins are fixed, and the majority of the vibration waves propagate along an inner surface or an outer surface of the housing lateral wall. Accordingly, according to configurations, in which propagation of vibration waves are attenuated or dispersed, in FIG. 8 and the like, resonance of other lead pins (particularly, lead pins for which wire bonding is completed) due to vibration, which occurs during wire bonding of a lead pin, is suppressed, and thus it is possible to suppress deterioration of connection strength in wire bonding with respect to the lead pin.

Hereinafter, description will be given of an optical modulator according to the invention with reference to examples.

First Example

FIG. 8 is a view illustrating a resonance suppressing structure according to a first example of the invention.

According to the first example, in a configuration in which units 17, in which a plurality of lead pins 14 are unitized, are arranged on a lateral wall of the housing 11, a concave portion 21 formed on an inner surface 11a side of an inter-unit lateral wall portion is provided as the resonance suppressing structure. For example, the concave portion 21 is formed to surround each of the units 17. The majority of vibration waves, which occur due to vibration of a lead pin, propagate along an inner surface side of a lateral wall portion of the housing. Accordingly, when a concave portion is provided in a portion along which the majority of the vibration waves propagate and a step difference is formed, it is possible to attenuate or disperse the majority of vibration waves. According to the above-described configuration, resonance of lead pins in other units, which occurs due to wire bonding with respect to a lead pin, is suppressed. Accordingly, it is possible to suppress deterioration of connection strength in the wire bonding with respect to the lead pins.

Second Example

Figure 9:
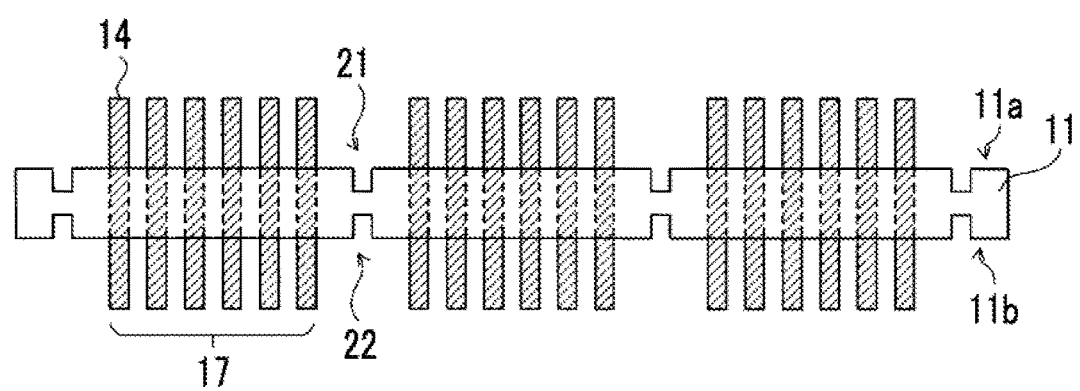
FIG. 9 is a view illustrating a resonance suppressing structure according to a second example of the invention.

FIG. 9 is a view illustrating a resonance suppressing structure according to a second example of the invention.

According to the second example, in the configuration in which the units 17, in which the plurality of lead pins 14 are unitized, are arranged on the lateral wall of the housing 11, the concave portion 21 formed on the inner surface 11a side of the inter-unit lateral wall portion, and a concave portion 22 formed on an outer surface 11b side thereof are provided as the resonance suppressing structure. According to this configuration, it is possible to attenuate or disperse not only vibration waves which propagate along the inner surface side of the lateral wall portion of the housing but also vibration waves which propagate along the outer surface side of the lateral wall portion, and thus this configuration is more effective.

Third Example

Figure 10:
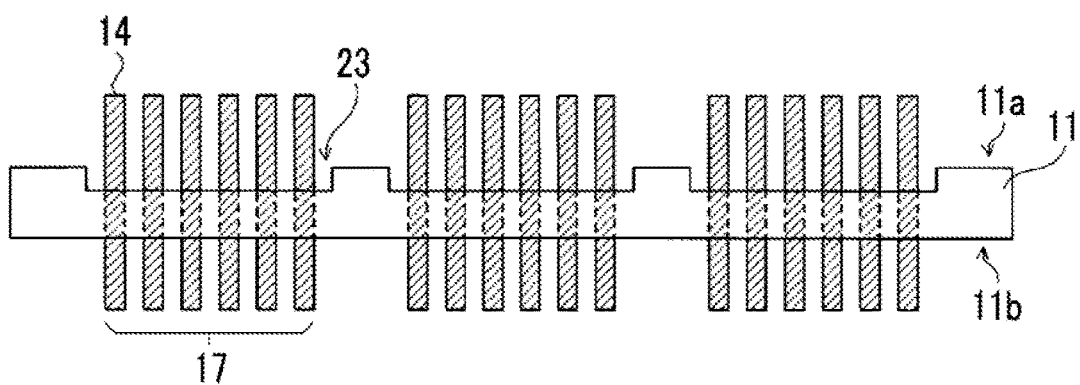
FIG. 10 is a view illustrating a resonance suppressing structure according to a third example of the invention.

FIG. 10 is a view illustrating a resonance suppressing structure according to a third example of the invention.

According to the third example, in the configuration in which the units 17, in which the plurality of lead pins 14 are unitized, are arranged on the lateral wall of the housing 11, a concave portion 23, which is formed on the inner surface 11a side of the lateral wall portion at which the units are arranged, is provided. This configuration can be also described as "a convex portion is formed on the inner surface 11a side of the inter-unit lateral wall portion as the resonance suppressing structure". According to this configuration, it is also possible to attenuate or disperse vibration waves which propagating along the inner surface side of the lateral wall portion of the housing, deterioration of connection strength in the wire bonding with respect to the lead pins is also suppressed.

Fourth Example

Figure 11:
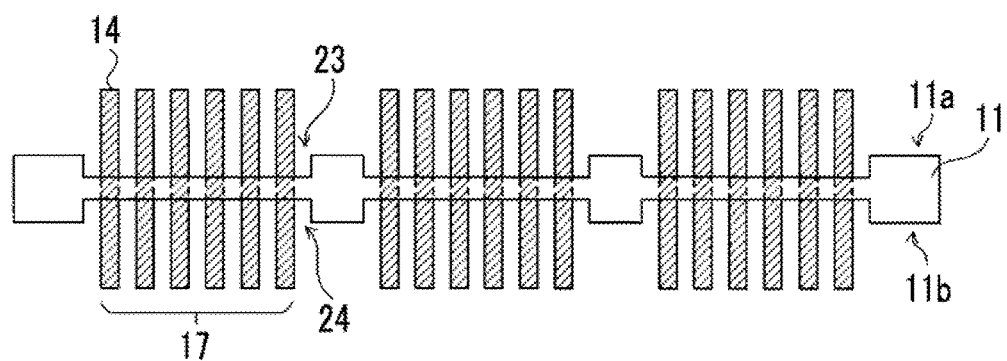
FIG. 11 is a view illustrating a resonance suppressing structure according to a fourth example of the invention.

FIG. 11 is a view illustrating a resonance suppressing structure according to a fourth example of the invention.

According to the fourth example, in the configuration in which the units 17, in which the plurality of lead pins 14 are unitized, are arranged on the lateral wall of the housing 11, the concave portion 23 formed on the inner surface 11a side of the lateral wall portion at which the units are arranged and a concave portion 24 formed on the outer surface 11b side of the lateral wall portion. This configuration can also be described as "a convex portion is formed both on the inner surface 11a side of the inter-unit lateral wall portion and on the outer surface 11b side thereof as the resonance suppressing structure". According to this configuration, it is possible to attenuate or disperse not only vibration waves which propagate along the inner surface side of the lateral wall portion of the housing but also vibration waves which propagate along the outer surface side of the lateral wall portion, and thus this configuration is more effective.

Here, in the first to fourth examples, as the resonance suppressing structure, several examples in which the concave portion or the convex portion is formed at least on the inner surface side of the inter-unit lateral wall portion, but the invention is not limited to the configurations. For example, the inter-unit concave portion in the first example and the second example can be changed into a convex portion. In addition, the concave portion of the unit portion in the third example and the fourth example can be changed into a convex portion. In addition, a plurality of the concave portions or a plurality of the convex portions may be provided between the units. In addition, the concave portion or the convex portion may be provided in the same plane in a mixed manner (for example, in an alternating manner). In brief, a shape formed in the lateral wall portion of the housing may be a shape capable of attenuating or dispersing the vibration waves.

Fifth Example

Figure 12:
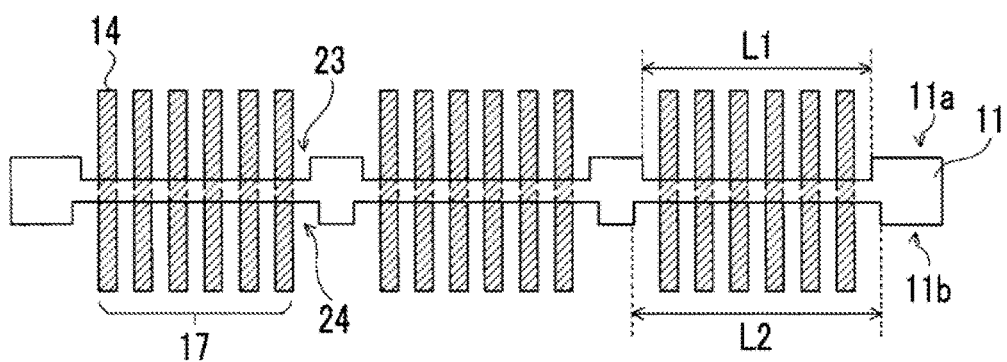
FIG. 12 is a view illustrating a resonance suppressing structure according to a fifth example of the invention.

FIG. 12 is a view illustrating a resonance suppressing structure according to a fifth example of the invention.

The fifth example is a modification example of the fourth example. In the fifth example, a width L1 of the concave portion 23 formed on the inner surface 11a side and a width L2 of the concave portion 24 formed on the outer surface 11b side are set to be different from each other. According to this configuration, it is possible to make a position (position of a step difference in the concave portion or the convex portion) at which the vibration waves are attenuated or dispersed be different between the inner surface side and the outer surface side, and thus it is possible to the effect of the vibration wave in a more efficient manner. Furthermore, a relationship of L1<L2 is satisfied in FIG. 12, a relationship of L1>L2 may be employed. In addition, so as to make the position of the step difference in the concave portion or the convex portion be different between the inner surface side and the outer surface side, only a position of the concave portion (or the convex portion) may be displaced (shifted) on the inner surface side or the outer surface side. In this case, a relationship of L1=L2 may be employed.

Sixth Example

Figure 13:
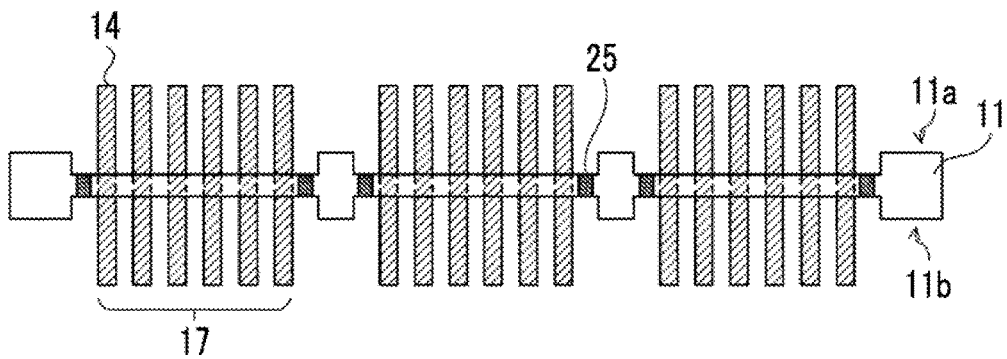
FIG. 13 is a view illustrating a resonance suppressing structure according to a sixth example of the invention.
Figure 14:
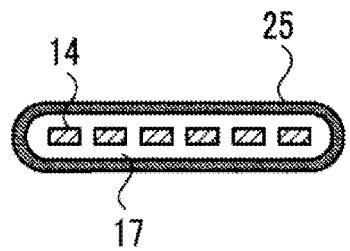
FIG. 14 is a view illustrating the resonance suppressing structure according to the sixth example of the invention from another direction.

FIG. 13 and FIG. 14 are views illustrating a resonance suppressing structure according to a sixth example of the invention. FIG. 13 illustrates a lateral wall portion to which the units are fixed in a cross-sectional view, and FIG. 14 illustrates the lateral wall portion in a plan view with focus given to one unit.

The sixth example is another modification example of the fourth example, and as an additional resonance suppressing structure, a heterogeneous metal material 25, of which at least one of a density or an elastic coefficient is different from that of a material of the housing 11, is disposed at least at a part of the inter-unit lateral wall portion. As described above with reference to Expression 1, a vibration frequency depends on a density and an elastic coefficient of a structural material. When a heterogeneous metal material different from the material of the housing is disposed between the units by using the above-described dependency, it is possible to allow a frequency (wavelength) of the vibration waves to vary at a portion of the heterogeneous metal material. When a frequency of vibration waves, which pass through the heterogeneous metal material, is different from a natural frequency of the lead pins, resonance of lead pins in other units, which occurs due to wire bonding with respect to a lead pin, is suppressed. Accordingly, it is possible to suppress deterioration of connection strength in wire bonding with respect to the lead pins in a more efficient manner.

As illustrated in FIG. 14, the heterogeneous metal material 25 is disposed to surround each of the units 17. For example, a heterogeneous metal material is disposed in the vicinity of a glass sealing material that is used to fix the units of the lead pins to the housing. As the heterogeneous metal material, an alloy that uses Sn, In, Pb, Ag, Au, and the like as a material can be used. A region in which the heterogeneous metal material is disposed has an operation of allowing a frequency of propagating vibration waves to vary, and thus the region can be referred to as "vibration frequency conversion region".

So as to enhance the resonance suppressing effect, it is desired to select a material, of which at least one of the density or the elastic coefficient is greatly different from that of the material of the housing, as the heterogeneous metal material. In addition, it is desired to dispose the heterogeneous metal material in a relatively large region. Furthermore, although the glass sealing material also has the resonance suppressing effect, a risk of occurrence of cracking and the like exists in the glass sealing material, and thus it is difficult to provide the glass sealing material in a wide width, and it is difficult to select the density and the elastic coefficient. Therefore, effectiveness of the heterogeneous metal material is higher in comparison of the glass sealing material.

Seventh Example

Figure 15:
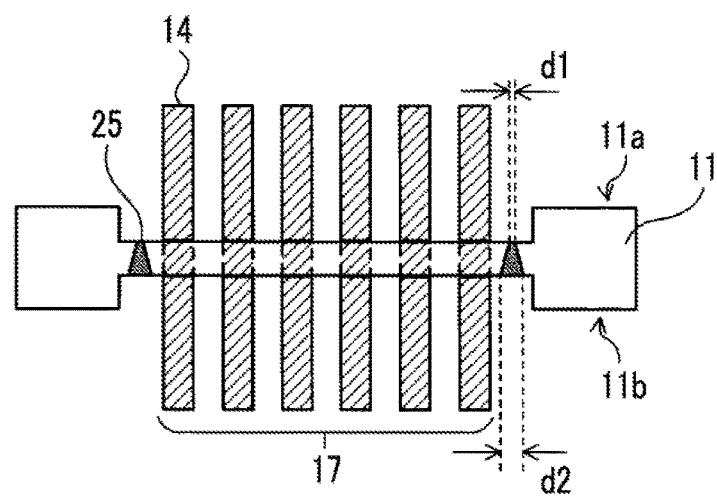
FIG. 15 is a view illustrating a resonance suppressing structure according to a seventh example of the invention.

FIG. 15 is a view illustrating a resonance suppressing structure according to a seventh example of the invention.

The seventh example is a modification example of the sixth example. In the seventh example, a width d1 of the heterogeneous metal material 25 on the inner surface 11a side and a width d2 thereof on the outer surface 11b side are set to be different from each other. The vibration frequency conversion region (region in which the heterogeneous metal material is disposed) has not only an operation of allowing a frequency of vibration wave to vary but also an operation of dispersing a propagating direction of the vibration waves. Accordingly, in the seventh example, the width of the vibration frequency conversion region is set to be different between on the inner surface side and on the outer surface side of the housing lateral wall, and thus it is possible to make a variation amount of a frequency of the vibration waves and a dispersion state of the propagating direction be different between on the inner surface side and on the outer surface side. As a result, the seventh example is more effective.

Eighth Example

Figure 16:
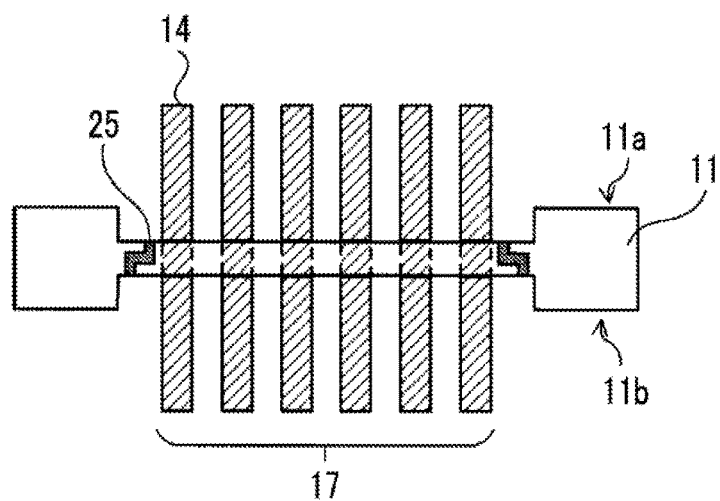
FIG. 16 is a view illustrating a resonance suppressing structure according to an eighth example of the invention.

FIG. 16 is a view illustrating a resonance suppressing structure according to an eighth example of the invention.

The eighth example is a modification example of the sixth example. In the eighth example, a position of the heterogeneous metal material 25 on the inner surface 11a side and a position thereof on the outer surface 11b side are set to be different from each other. According to this configuration, it is possible to make attenuation or dispersion of the vibration waves propagating along a surface of the housing lateral wall be different between on the inner surface side and on the outer surface side. According to this configuration, it is also possible to enhance an effect of dispersing the propagating direction of the vibration waves while changing the frequency of the vibration waves, and thus this configuration is also effective.

Figure 17:
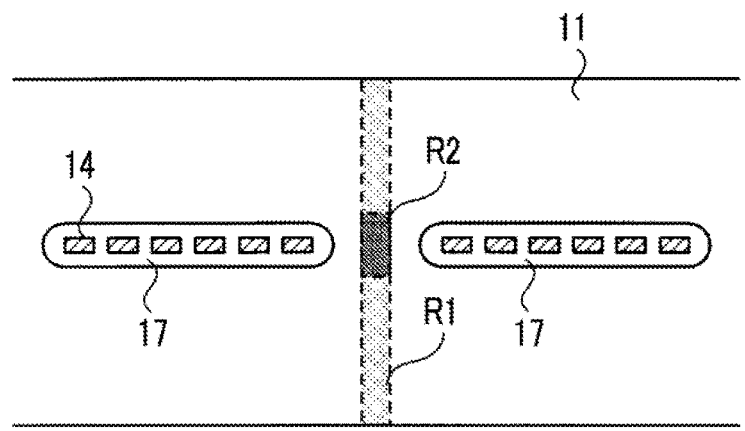
FIG. 17 is a view illustrating another arrangement example of the resonance suppressing structure according to the first to eighth examples of the invention.

Here, in the examples described above, the resonance suppressing structure (the concave portion, the convex portion, or the heterogeneous metal material) is provided to surround each of the units of the lead pins, but a method of providing the resonance suppressing structure is not limited thereto. As an example, as indicated by a reference numeral R1 in FIG. 17, a linear resonance suppressing structure, which extends from an upper side to a lower side of the lateral wall of the housing 11, may be provided between units in the lateral wall portion of the housing 11. As another example, as indicated by a reference numeral R2 in FIG. 17, a resonance suppressing structure having an approximately the same length as the width (the length in an upper and lower direction in the drawing) of the unit 17 may be provided between the units in the lateral wall portion of the housing 11. In brief, the resonance suppressing structure may be provided in a region portion along which the majority of vibration waves propagate in the region between the units.

Ninth Example

In the first to eighth examples described above, the concave portion or the convex portion is provided between the units of the lead pins, or the heterogeneous metal material is provided, but the resonance suppressing structures may be provided between individual lead pins.

Figure 18:
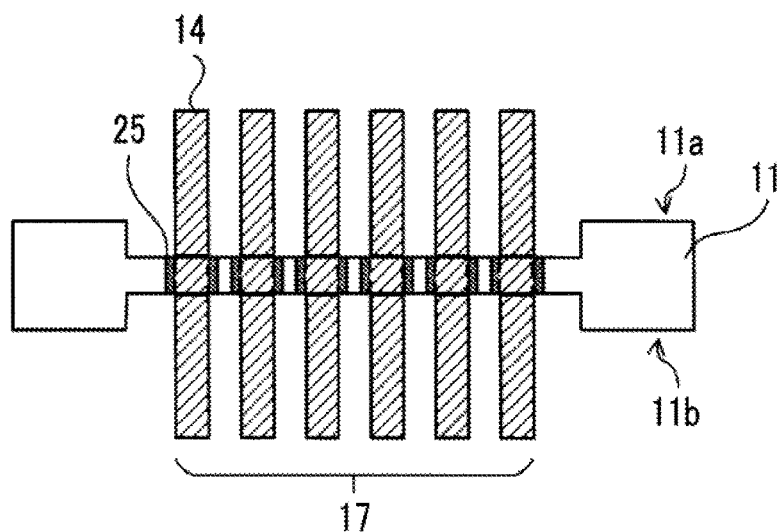
FIG. 18 is a view illustrating a resonance suppressing structure according to a ninth example of the invention.
Figure 19:
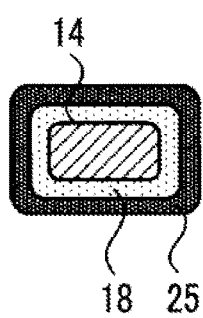
FIG. 19 is a view illustrating an example in which one-layer heterogeneous metal material is used in the ninth example of the invention.

FIG. 18 is a view illustrating a resonance suppressing structure according to a ninth example of the invention. FIG. 19 is a view illustrating an example in which one-layer heterogeneous metal material is used as the resonance suppressing structure, and FIG. 20 is a view illustrating an example in which two-layer heterogeneous metal material is used as the resonance suppressing structure.

In the ninth example, the heterogeneous metal material 25 is disposed between individual lead pins. This configuration becomes more complicated in comparison to the configuration in which the resonance suppressing structure is provided between the units of the lead pins, but it is possible to suppress resonance of the lead pins in a more efficient manner.

As described above, although the glass sealing material also has the resonance suppressing effect, there is a problem that it is difficult to provide the glass sealing material in a wide width in consideration of a problem related to reliability such as a concern of cracking or cracks due to a difference in linear expansion coefficient, and it is difficult to select the density and the elastic coefficient. Accordingly, in the ninth example, as illustrated in FIG. 19, the heterogeneous metal material 25 is disposed to surround a glass sealing material 18 in the vicinity of the glass sealing material 18 configured to fix the lead pins 14 to the housing 11. For example, a metal ring, a brazing material, and the like can be used as the heterogeneous metal material.

Figure 20:
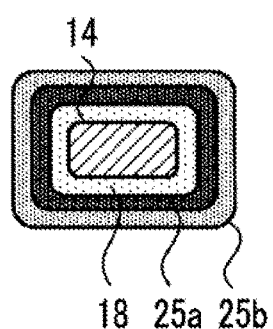
FIG. 20 is a view illustrating an example in which two-layer heterogeneous metal material is used in the ninth example of the invention.

Furthermore, as illustrated in FIG. 20, two kinds of heterogeneous metal materials 25a and 25b may be disposed to surround the glass sealing material 18. As a heterogeneous metal material on an inner peripheral side, for example, the brazing material and the like can be used. In addition, as a heterogeneous metal material on an outer peripheral side, for example, the metal ring (Kovar and the like) can be used. As described above, the heterogeneous metal material having a multi-layer structure, it is possible to suppress resonance of the lead pins in a more efficient manner.

Tenth Example

Figure 21:
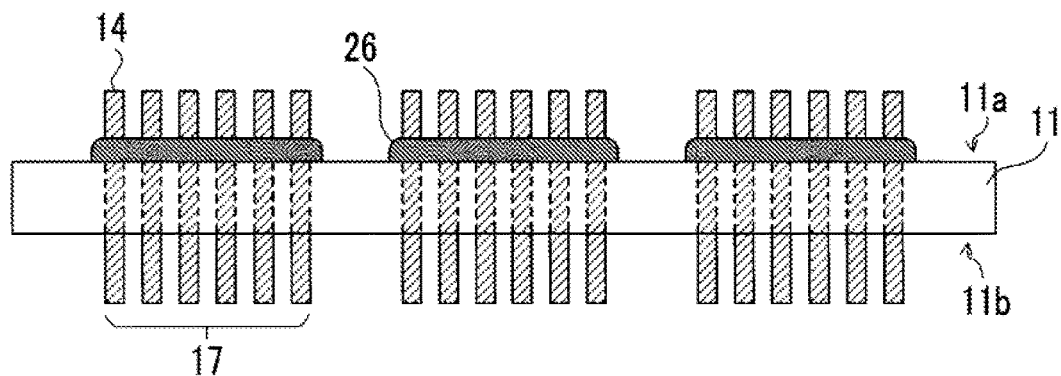
FIG. 21 is a view illustrating a resonance suppressing structure according to a tenth example of the invention.

FIG. 21 is a view illustrating a resonance suppressing structure according to a tenth example of the invention.

According to the tenth example, in the configuration in which the units 17, in which the plurality of lead pins 14 are unitized, are arranged on the lateral wall of the housing 11, as the resonance suppressing structure, a vibration absorbing member 26, which absorbs vibration, is provided at least on the inner surface 11a side of the lateral wall portion. As the vibration absorbing member, for example, an epoxy-based adhesive, an acryl-based adhesive, a rubber-based adhesive, and the like can efficiently attenuate vibration energy, and thus these adhesives are effective. According to this configuration, the vibration waves are absorbed and attenuated by the vibration absorbing member, and thus resonance of the lead pins is suppressed. The vibration absorbing member maybe provided to be interposed between at least lead pins, and for example, the vibration absorbing member may be provided for each lead pin to surround the vicinity of the lead pin.

Eleventh Example

Figure 22:
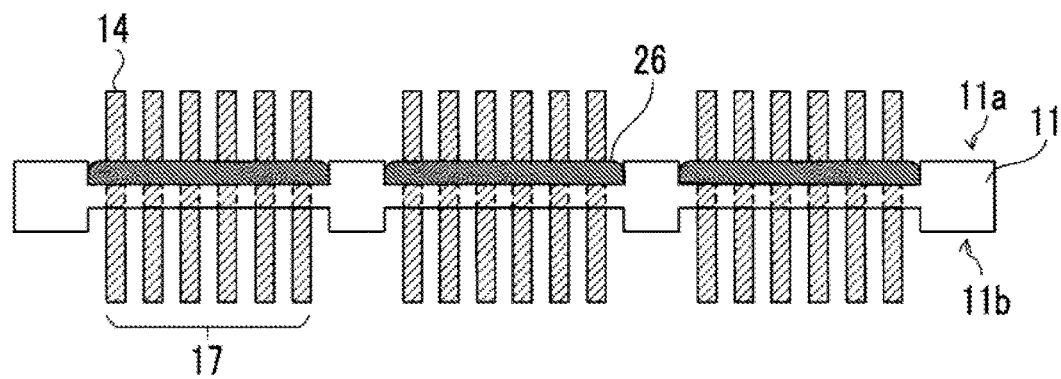
FIG. 22 is a view illustrating a resonance suppressing structure according to an eleventh example of the invention.

FIG. 22 is a view illustrating a resonance suppressing structure according to an eleventh example of the invention.

The eleventh example corresponds to a combination of the fourth example and the tenth example. In the eleventh example, and a concave portion formed on the inner surface 11a side of the lateral wall portion in which the units 17 are provided, and a concave portion formed on the outer surface 11b side thereof are provided. In addition, the vibration absorbing member 26, which absorbs vibration, is provided in the concave portion that is formed on the inner surface 11a side. According to this configuration, it is possible to attain an operation of attenuating or dispersing vibration waves due to a step difference formed in the lateral wall portion of the housing, and an operation of absorbing the vibration waves due to the vibration absorbing member in a composite manner, and thus this configuration is more effective.

Figure 23:
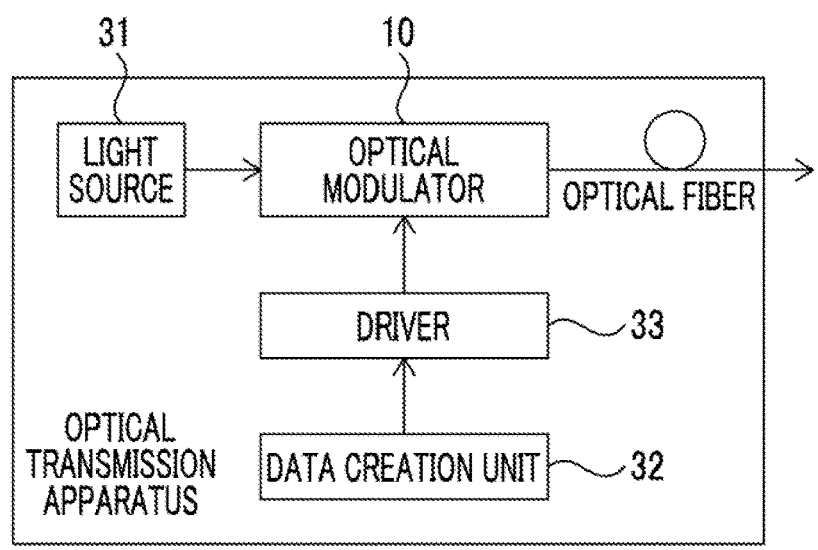
FIG. 23 is a block diagram illustrating a configuration example of an optical transmission apparatus on which the optical modulator of the invention is mounted.

FIG. 23 is a block diagram illustrating a configuration example of an optical transmission apparatus on which the optical modulator according to the invention is mounted. The optical transmission apparatus includes a light source 31, a data creation unit 32, a driver 33, and the like in addition to the optical modulator 10. As the optical modulator 10, an optical modulator having the resonance suppressing structure described in each of the examples is used.

The data creation unit 32 creates signal data to be transmitted from the optical transmission apparatus, and inputs the signal data to the driver 33. The driver 33 amplifies the input signal data, and creates a high-frequency signal having a waveform corresponding to the signal data. The high-frequency signal created by the driver 33 is input to an RF input unit of the optical modulator 10 through an external circuit substrate.

In addition to the RF input unit, the optical modulator 10 includes a plurality of lead pins as a signal input unit for a bias control of a plurality of optical modulator units formed on an optical modulation element, or as an output unit of a monitor PD (photo detector) that generates an electrical signal that is used for the bias control. For example, as a DP-QPSK modulator in which four RF input units, four optical modulator units, and two monitor PDs for feedback are integrated, a DP-QPSK, which includes 18 lead pins including a ground pin or a not connect (NC) pin, is known. The respective lead pins are fixed and connected to a bias control circuit and the like, which are provided in the optical transmission apparatus, by using solder and the like, and a DC voltage or a low-frequency electrical signal is applied to the respective lead pins. The respective lead pins are set so that transmission characteristics of the optical transmission apparatus can be operated in a satisfactory and stable manner.

As described above, according to the invention, even in a case of using an optical modulator having a lead pin configuration capable of being air-tightly sealed at a relatively low cost, it is possible to provide a small-size and high-reliability optical modulator. In addition, when mounting the optical modulator according to the invention on the optical transmission apparatus, it is possible to provide a high-reliability optical transmission apparatus.

Here, in the above-described examples, LN is used in a substrate of the optical modulation element, but substrates using other materials may be used. In addition, in the above-described examples, description has been given of a case where four high-frequency signal electrodes are provided as an example, but there is no limitation to the number.

In addition, although not specifically illustrated, it is needless to say that it is possible to employ a configuration in combination of several configurations illustrated in the examples.

The invention can be used in an optical modulator including a plurality of lead pins which are fixed to a lateral wall of a housing and include a portion protruding into an inner space of the housing.

What is claimed is:

1. An optical modulator comprising:
an optical modulation element that is accommodated in a housing, wherein a plurality of lead pins, which are electrically connected to the optical modulation element through wire bonding, are fixed to a lateral wall of the housing, each of the plurality of lead pins includes a portion that protrudes into an inner space of the housing, and
a resonance suppressing structure, which is configured to suppress resonance between the lead pins, is formed on an outer surface of the lateral wall to which the plurality of lead pins are fixed.

2. The optical modulator according to claim 1, wherein as the resonance suppressing structure, a concave portion or a convex portion, which is formed at least on an inner surface side of the lateral wall, is provided.

3. The optical modulator according to claim 2, wherein as the resonance suppressing structure, a concave portion or a convex portion which is formed on an outer surface side of the lateral wall is further provided, and a position of a step difference in the concave portion or the convex portion is set to be different between the inner surface side and the outer surface side.

4. The optical modulator according to claim 1, wherein as the resonance suppressing structure, a material, of which at least one of a density and an elastic coefficient is different from at least one of a density and an elastic coefficient of a material of the housing, is disposed at least at a part of the lateral wall.

5. The optical modulator according to claim 1, wherein as the resonance suppressing structure, a vibration absorbing member, which absorbs vibration, is provided at least on an inner surface side of the lateral wall.

* * * * *